United States Patent
Shimizu et al.

(10) Patent No.: US 7,057,948 B2
(45) Date of Patent: Jun. 6, 2006

(54) SEMICONDUCTOR INTEGRATED CIRCUIT DEVICE HAVING A TEST FUNCTION

(75) Inventors: Mitsuru Shimizu, Kawasaki (JP); Tetsuya Yamamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 10/829,949

(22) Filed: Apr. 23, 2004

(65) Prior Publication Data

US 2004/0213058 A1 Oct. 28, 2004

(30) Foreign Application Priority Data

Apr. 28, 2003 (JP) .............................. 2003-123740

(51) Int. Cl.
*G11C 7/00* (2006.01)

(52) U.S. Cl. ................. 365/200; 365/201; 365/230.03; 365/233

(58) Field of Classification Search ................ 365/200, 365/201, 230.03, 233
See application file for complete search history.

(56) References Cited

U.S. PATENT DOCUMENTS 5,801,986 A * 9/1998 Matsumoto et al. ... 365/185.09
6,166,972 A * 12/2000 Hidaka ....................... 365/200

FOREIGN PATENT DOCUMENTS

JP 4-208880 7/1992

* cited by examiner

*Primary Examiner*—Richard Elms
*Assistant Examiner*—Toan Le
(74) *Attorney, Agent, or Firm*—Oblon, Spivak, McClelland, Maier & Neustadt, P.C.

(57) ABSTRACT

A semiconductor memory device includes a memory collar, a repair data analyzer, a BIST block, and a system logic. The memory collar includes a memory cell and a spare cell and have a redundancy function of replacing fail memory cell with the spare cell if fail memory cell exists. The repair data analyzer determines whether or not memory cell included in the memory collar is defective, and generates fail address corresponding to the memory cell determined as being defective. The BIST block operates in synchrony with a first clock signal inputted to a first clock signal terminal in a test operation mode, and controls the operation of the memory collar. The system logic operates in synchrony with a second clock signal inputted to a second clock signal terminal in the test operation mode.

23 Claims, 7 Drawing Sheets

SEMICONDUCTOR INTEGRATED CIRCUIT DEVICE HAVING A TEST FUNCTION

CROSS-REFERENCE TO RELATED APPLICATIONS

This application is based upon and claims the benefit of priority from prior Japanese Patent Application No. 2003-123740, filed Apr. 28, 2003, the entire contents of which are incorporated herein by reference.

BACKGROUND OF THE INVENTION

1. Field of the Invention

The present invention relates to a memory embedded logic LSI device. In particular, the present invention relates to a semiconductor integrated circuit device in which a test is carried out with respect to memory and logic circuits.

2. Description of the Related Art

Conventionally, logic LSI and memory LSI have been used separately from each other as the need arises. However, the semiconductor micro-fabrication technique has recently advanced, and thereby, both logic LSI and memory LSI are assembled into one chip. In recent years, product development has been frequently made in memory embedded logic LSI devices embedding logic and memory circuits in one chip. For example, in DRAM embedded logic LSI devices, DRAMs having memories of several to tens of megabytes have been realized.

Memory circuits have large capacities, and thereby, it is impossible to request chips having no defect at all. In this case, it is common in memory embedded LSI devices to include a redundancy function for repairing fail cells. This redundancy function thereby stabilizes the yield.

FIG. 1 shows the general test flow in the wafer state of embedded LSI memory devices having a redundancy function.

First, a wafer test (first) using a memory tester is carried out. Here, pass/fail determination of memory circuits is not carried out. In this case, since the redundancy function is given, it is determined whether or not an LSI chip is usable as a good chip if defect cell is replaced with a spare cell. If the chip is usable as a good chip after repair using the redundancy function, an address for the replacement is acquired.

In the next repair process, fuse blow is carried out using the address acquired in the wafer test (first).

A wafer test (second) using the memory tester is carried out. This is a test for confirming whether the cell has been correctly replaced with the spare cell.

Finally, a logic test, that is, wafer test (third) using a logic tester is carried out.

The chip passing all of three wafer tests described above is used as good chip.

The memory test shown in FIG. 1 is carried out using a multiplexer separation method calling a direct access method, in general. According to the multiplexer separation method, a memory is tested in a state that the memory circuit is separated from the peripheral logic circuits.

FIG. 2 is a block diagram schematically showing the configuration of a memory embedded logic LSI device employing the multiplexer separation method. The system logic 51 and embedded memory (e.g., RAM) 52 are separated using two multiplexers (MUX) 53 and 54. In other words, the changeover of two multiplexers 53 and 54 is made to guide input and output signals of the memory 52 to a terminal (external terminal). By doing so, input and output terminals of the memory 52 are directly controlled so that the memory test can be carried out.

More specifically, the LSI device entries in a test mode using a test mode (TM) pin. The test mode signal is supplied to multiplexers 53 and 54. Thereafter, system logic 51 and memory 52 commonly using input and output terminals are separated via these multiplexers 53 and 54.

Using the foregoing multiplexer separation method and the memory test, the fail address to be repaired using the redundancy function must be found (called "find repair solution"). The memory tester has a function of storing an address corresponding to a fail memory cell. The fail address is read, and thereafter, the fail memory cell is replaced with a spare cell, and thereby, it can be seen whether or not full bit operation is made.

On the other hand, in memory embedded LSI devices having no redundancy function, the memory test is carried out using a memory BIST (Built-In Self Test) circuit.

FIG. 3 is a block diagram showing the configuration of a conventional memory embedded LSI device including a BIST circuit. A BIST logic controller 61 is a module for controlling a BIST test. An address generator 62 comprises a counter circuit for generating address data supplied to memory. The generated address data is supplied to an address terminal of the memory. In this case, two RAMs (Macro) 63 and 64 are used as the memory. An address control logic 66 determines whether a test is carried out with respect to which of memories (RAM) in the case where several memories such as RAMs 63 and 64 exist. Further, the address control logic 66 controls the wide multiplexer 67, signature register (data compressor) 68, RAMs 63 and 64.

The wide multiplexer 67 selects the output of a test target memory, and supplies it to the signature register 68. The signature register 68 is a parallel data input linear feedback shift register, and compresses the output data of the memory. The tester compares a signal (shift out) outputted from the signature register 68 with an expected value, and thereby, it is determined whether or not a defect occurs in the memory.

Conventionally, the test is carried out for memory embedded logic LSI devices having the redundancy function. In this case, the test cost remarkably increases as compared with logic LSI devices embedding no memory or memory embedded logic LSI devices having no redundancy function. In other words, only the wafer test (third) of FIG. 1 is carried out in the logic LSI devices. On the contrary, three wafer tests must be carried out in the memory embedded logic LSI devices. For this reason, the following problems arise:

(1) Test devices, such as test boards and probe cards for carrying out the test, must be prepared; for this reason, the test cost increases.

(2) Three test are carried out; for this reason, the test time is much longer as compared with that for logic LSI devices, thus the test cost increases.

(3) Two tests, that is, a wafer test for memory testing and a logic test for logic testing must be performed; for this reason, resources for acquiring the evidence data are required twice.

Incidentally, a semiconductor device having a RAM with a BIST is disclosed in JPN. PAT. APPLN. KOKAI Publication No. 4-208880, for example.

BRIEF SUMMARY OF THE INVENTION

According to one aspect of the present invention, there is provided a semiconductor integrated circuit device comprises:

at least one memory block including several memory cells and several spare cells, and having a redundancy function of replacing a fail memory cell with the spare cell if the fail memory cell exists in the several memory cells;

at least one determination/fail address generator circuit connected to the at least one memory block, determining whether or not memory cell included in at least one memory block is defective, and generating a fail address corresponding to the memory cell determined as being defective;

a first control circuit connected to the at least one memory block and the at least one determination/fail address generator circuit, supplied with a first clock signal having a first frequency in a test operation mode, and operating in synchronous with the first clock signal to control each operation of the at least one memory block and the at least one determination/fail address generator circuit; and a logic circuit supplied with a second clock signal having a second frequency in the test operation mode, and operating in synchronous with the second clock signal while making data exchange with the at least one memory block in a normal operation mode.

DETAILED DESCRIPTION OF THE INVENTION

An embodiment of the present invention will be described below with reference to the accompanying drawings.

Figure 4:
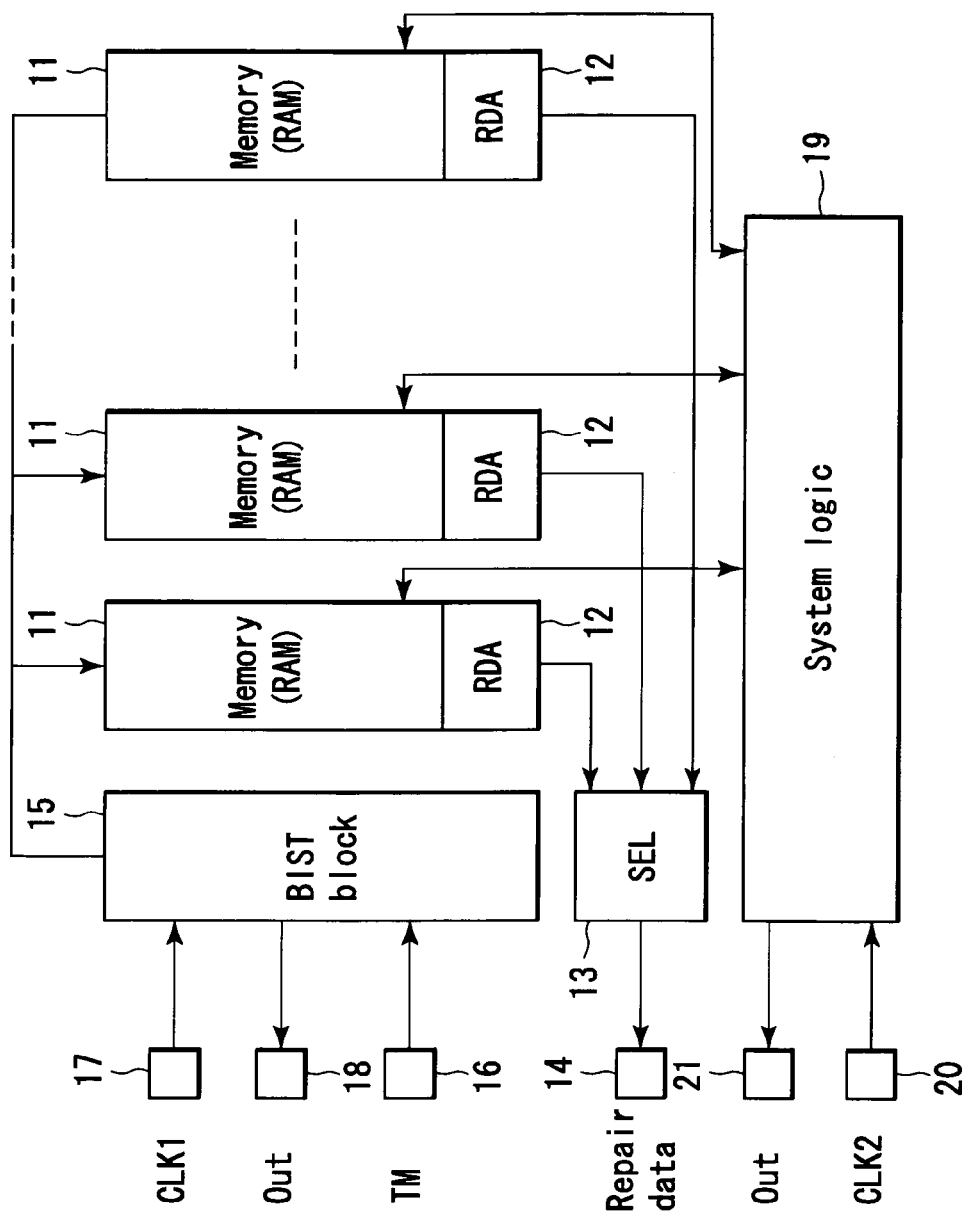
FIG. 4 is a block diagram showing the entire configuration of a memory embedded logic LSI device according to one embodiment of the present invention.

FIG. 4 is a block diagram showing the entire configuration of a memory embedded logic LSI device. The LSI device is provided with a plurality of memory collars 11 each having a RAM as memory. The memory collars 11 each include a memory cell array and peripheral circuits such as row decoder and column decoder. The memory collar 11 carries out a test to determine whether or not memory cells included in the memory cell array have failed. If a fail cell exists, the memory collar 11 has a redundancy function of generating a fail cell address and replacing it with a redundancy spare cell. A repair data analyzer (RDA) 12 included in each memory collar 11 generates the fail cell address. A selector circuit (SEL) 13 selects the fail cell address generated by the repair data analyzer 12 included in each memory collar 11. Thereafter, the fail cell address is outputted as repair data from an output terminal 14.

A BIST block 15 controls the test operation of each memory collar 11. The test operation is activated by a test mode signal (TM) inputted to a test signal terminal 16. The test operation is activated, and thereafter, the test operation is controlled in synchrony with a clock signal CLK1 supplied to a clock signal terminal 17. An output signal (OUT) such as a test result is outputted from an output signal terminal 18. Incidentally, the BIST block 15 has a test function, and the self-test of the BIST block 15 is carried out prior to a memory test. If the BIST block operates normally, the memory test is carried out.

System logic 19 comprises a logic circuit or operational circuit. The system logic 19 performs data exchange with the foregoing plurality of memory collars to execute various logic/operational processings in a normal operation mode. During the test operation mode, the operation of the system logic 19 is controlled in synchrony with a clock signal CLK2 inputted to a clock signal terminal 20. The output signal (OUT) from the system logic 19 is outputted from an output signal terminal 21.

Figure 5:
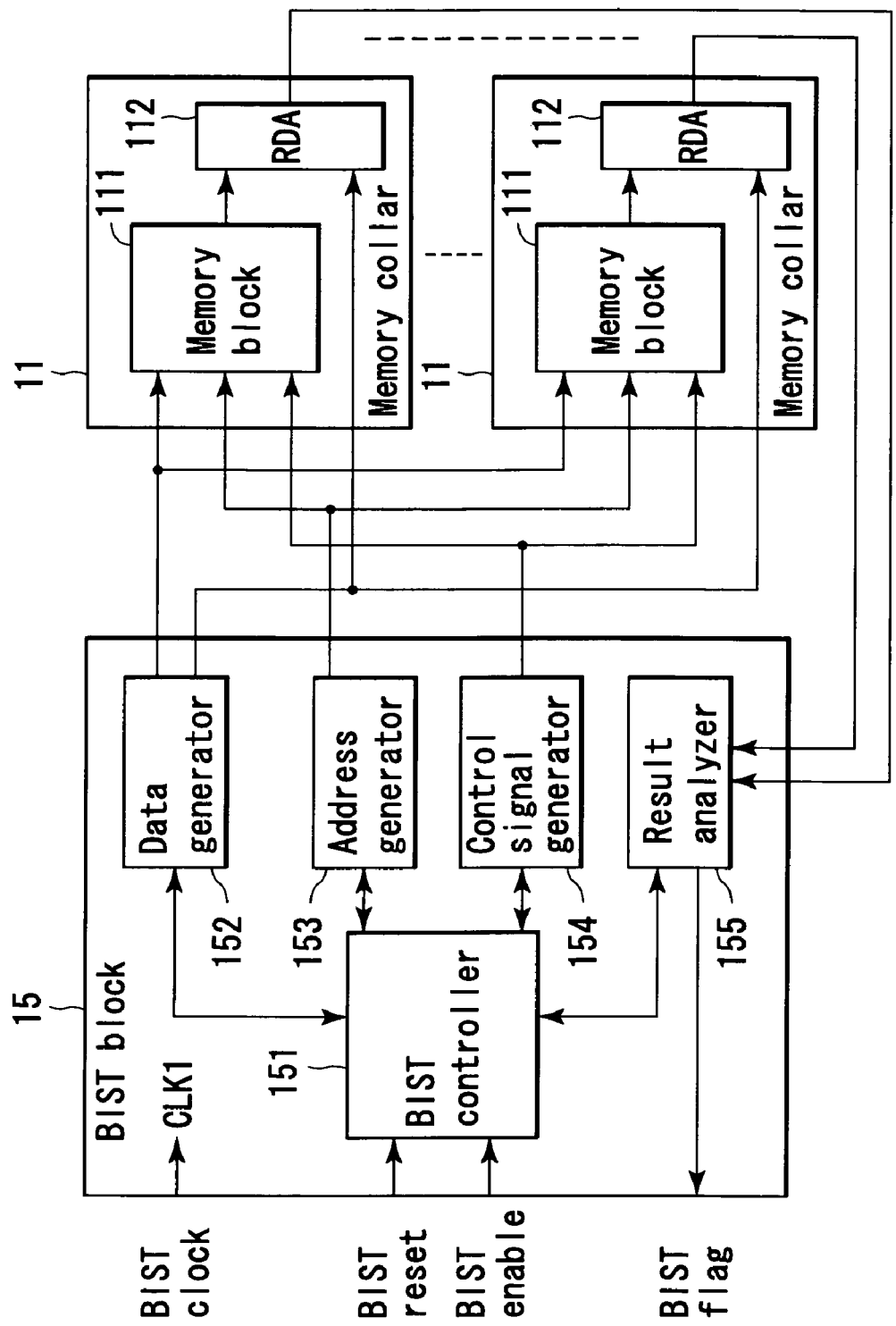
FIG. 5 is a block diagram showing each configuration of a memory collar and BIST block shown in FIG. 4.

FIG. 5 is a block diagram showing each configuration of the memory collar 11 and the BIST block 15 shown in FIG. 4. The BIST block 15 is composed of BIST controller 151, data generator 152, address generator 153, control signal generator 154 and result analyzer 155. More specifically, the BIST controller 151 controls a BIST test, and the data generator 152 generates data supplied to memory collar 11 and the like. The address generator 153 generates address supplied to the memory collar 11, and the control signal generator 154 generates various control signals such as write and read control signals supplied to the memory collar 11. The result analyzer 155 receives the test result generated in each memory collar 11 during the test operation mode, and determines whether or not a memory cell of each memory collar 11 is defective.

The BIST block 15 is supplied with a clock signal CLK1 or clock signal internally generated in synchronous with the clock signal CLK1 as a synchronizing signal (BIST Clock). The BIST controller 151 is activated based on an enable signal (BIST Enable) and reset based on a reset signal (BIST Reset). The result analyzer 155 generates a flag (BIST Flag) determining whether or not a memory cell is defective.

Each memory collar 11 includes a plurality of memory cells and a plurality of spare cells. The memory collar 11 is composed of a memory block 111 having a redundancy function and a determination/fail address generator circuit 112. The determination/fail address generator circuit 112 compares data read from the memory block 111 with data generated by the data generator 152 of the BIST controller 151 to determine whether or not a memory cell is defective. Further, the determination/fail address generator circuit 112 generates a fail address corresponding to the memory cell which has been determined to be defective. The RDA 12 shown in FIG. 4 is included in the determination/fail address generator circuit 112. An output of the determination/fail address generator circuit 112 is supplied to the result analyzer 155 in the BIST block 15.

Figure 6:
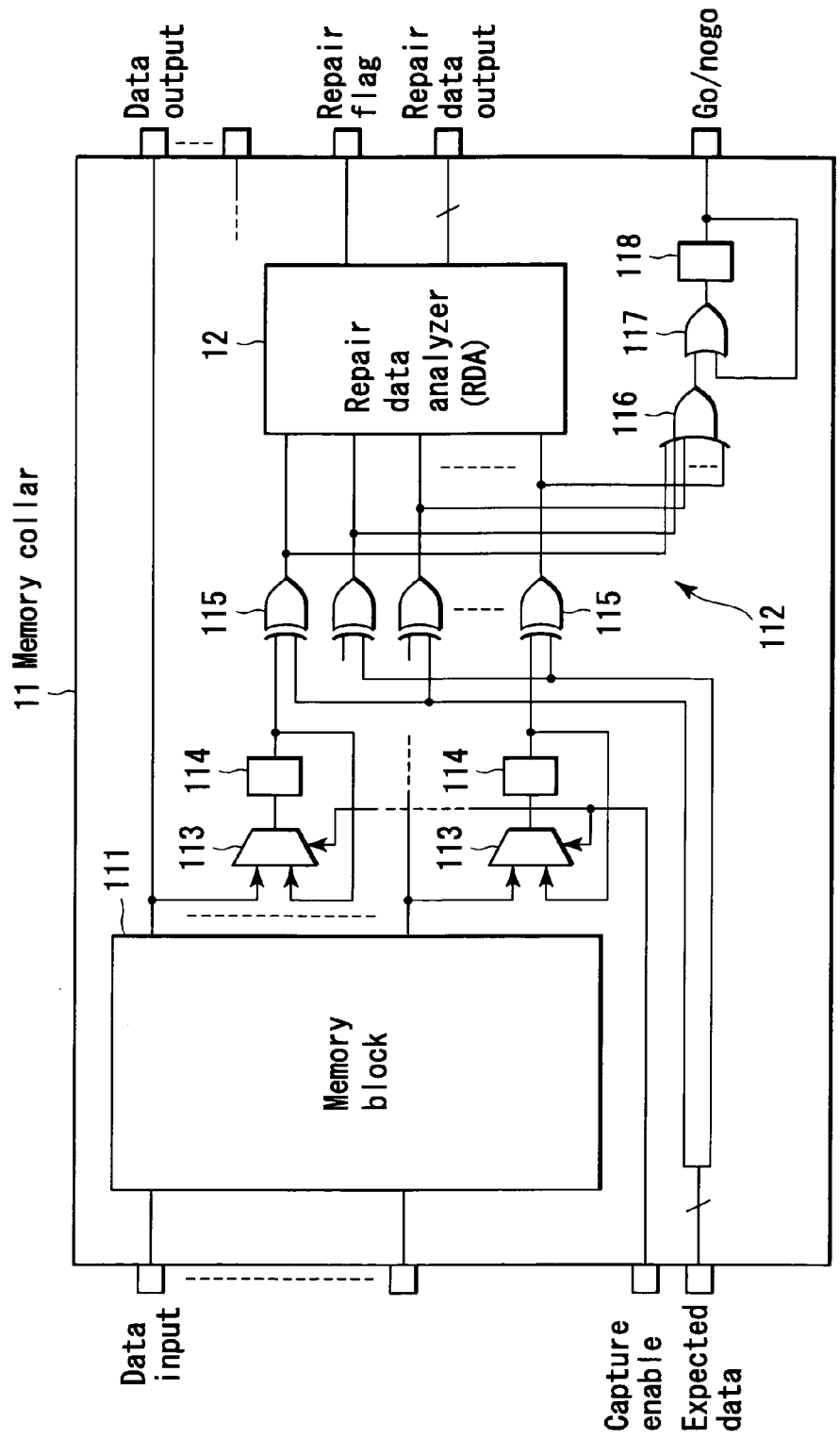
FIG. 6 is a block diagram showing the detailed configuration of the memory collar shown in FIG. 4.
Figure 7:
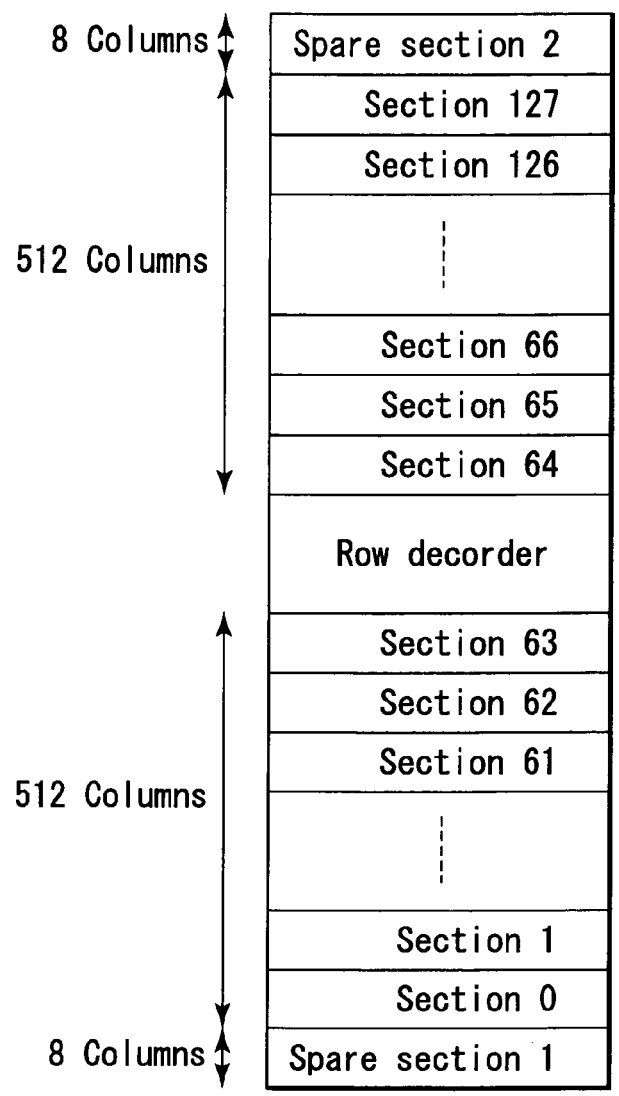
FIG. 7 is a block diagram showing the configuration of a memory cell array included in the memory shown in FIG. 4.

FIG. 6 shows the detailed configuration of each memory collar 11. Here, the memory cell array included in the memory block 111 has the arrangement shown in FIG. 7. The same number (64 sections in this embodiment) of sections and one spare section are arrayed on each side of the row decoder provided at the center. More specifically, sections 0 to 63 and spare section 1 are arrayed at one side while sections 64 to 127 and spare section 2 are arrayed at the other side.

Sections and spare sections are each composed of 8 columns. Each column is provided with several memory cells and spare cells. The memory cell and spare cell basically have the same configuration. If a fail cell exists in the side of the sections 0–63, the fail cell is replaced with a spare cell included in the spare section 1. Likewise, if a fail cell exists in the side of the sections 64–127, the fail cell is replaced with a spare cell included in the spare section 2. In this manner, the fail cell is replaced with the spare cell included in the spare section for every column.

The spare cell included in sections and spare sections may be any of the following memory cells. One is a dynamic memory cell, and another is a static memory cell. Another is a ferroelectric memory cell having a ferroelectric capacitor holding a ferroelectric film between a pair of electrodes.

Figure 8:
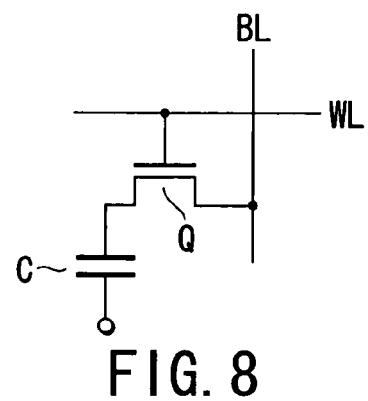
FIG. 8 is a circuit diagram to explain one example of a memory cell and spare cell forming the memory cell array shown in FIG. 7.

FIG. 8 shows the configuration of one dynamic memory cell used as a memory cell and spare cell. The memory cell is composed of one MOS transistor Q and one capacitor C. One terminal of the MOS transistor Q is connected with a bit line BL while the gate thereof is connected with a word line WL.

Figure 9:
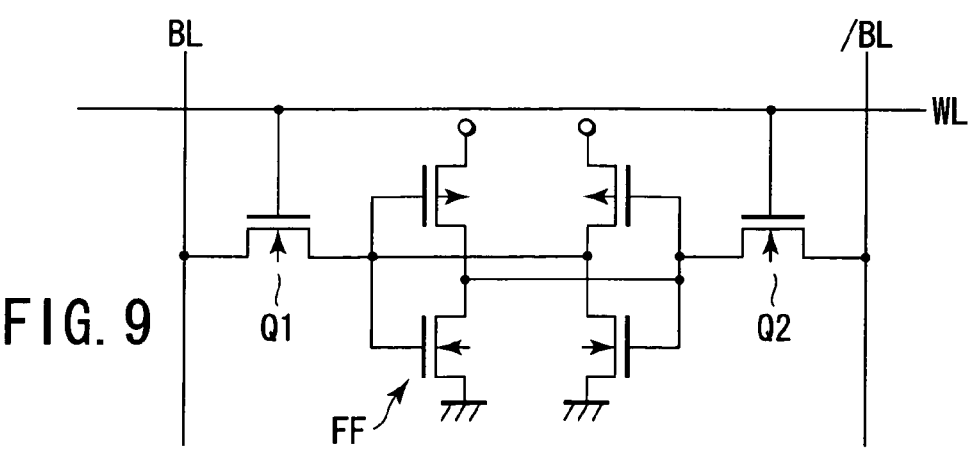
FIG. 9 is a circuit diagram to explain another example of a memory cell and spare cell forming the memory cell array shown in FIG. 7.

FIG. 9 shows the configuration of one static memory cell used as memory cell and spare cell. The memory cell is composed of flip-flop FF, transfer gate MOS transistors Q1 and Q2. More specifically, the flip-flop FF has two inverter input-output nodes, which each comprise P-channel and N-channel MOS transistors, and these nodes make cross connection. The transfer gate MOS transistors Q1 is connected between one memory node of the flip-flop and one bit line BL, and has a gate connected to a word line WL. The transfer gate MOS transistors Q2 is connected between the other memory node of the flip-flop and the other bit line/BL, and has a gate connected to the word line WL.

Figure 10:
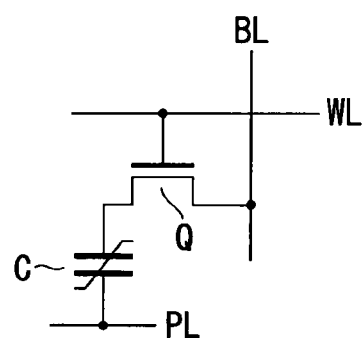
FIG. 10 is a circuit diagram to explain another example of a memory cell and spare cell forming the memory cell array shown in FIG. 7.

FIG. 10 shows the configuration of one ferroelectric memory cell used as a memory cell and spare cell. The memory cell is composed of one MOS transistor Q and one ferroelectric capacitor C. One terminal of the MOS transistor Q is connected with a bit line BL while the gate thereof is connected with a word line WL. One terminal of the ferroelectric capacitor C is connected with a plate line PL. In other words, the ferroelectric capacitor C holding a ferroelectric film between a pair of electrodes is connected between the other terminal of the MOS transistor Q and the plate line PL.

In the memory block 111, data write and read are concurrently carried out at the unit of 128 bits. In the normal operation mode, data read from the memory block 111 is outputted as output data (Date Output) from the memory collar 11. In the test operation mode, previously stored 128-bit test data is read from the memory block 111, and thereafter, captured in each capture register 114 via each multiplexer 113. The operation of each multiplexer 113 is controlled according to a capture enable signal (Capture Enable). Data captured in each capture register 114 is compared with two-bit expected data (Expected Data) by 128 exclusive OR gate circuits 115. The data generator 152 shown in FIG. 5 generates the expected data (Expected Data).

The reason why two-bit data is used is as follows. In the memory cell array shown in FIG. 7, the column of 64 sections (Section 0–63) arranged below the row decoder is replaced with the spare column of the spare section 1. Likewise, the column of 64 sections (Section 64–127) arranged above the row decoder is replaced with the spare column of the spare section 2. Therefore, the expected data is not limited to two-bit data.

The outputs of the exclusive OR gate circuits 115 are supplied to the repair data analyzer (RDA) 12 while being supplied to an OR gate circuit 116. The output of the OR gate circuit 116 is supplied to a flag register 118 via an OR gate circuit 117. The output of the flag register 118 is supplied to the OR gate circuit 117. The flag register 118 outputs a flag (Go/No go) showing whether or not fail memory cell exists in the memory block 111.

The output of the exclusive OR gate circuit 115 becomes level H if a memory cell from which data is a read is fail memory cell and data read from the fail memory cell does not coincide with the logic level of the expected data. Thus, the flag (Go/No go) becomes level H so long as only one fail bit exists.

The repair data analyzer 12 outputs a repair flag (Repair Flag) if there is a need to use a redundancy function based on the comparison result outputted from each exclusive OR gate circuit 115. Further, the repair data analyzer 12 generates column address where a fail memory cell exists, and outputs it as repair data (Repair Data Output).

The determination/fail address generator circuit 112 shown in FIG. 5 is composed of the foregoing multiplexers 113, capture registers 114, exclusive OR gate circuits 115, OR gate circuits 116, 117, flag register 118 and repair data analyzer (RDA) 12.

Figure 11:
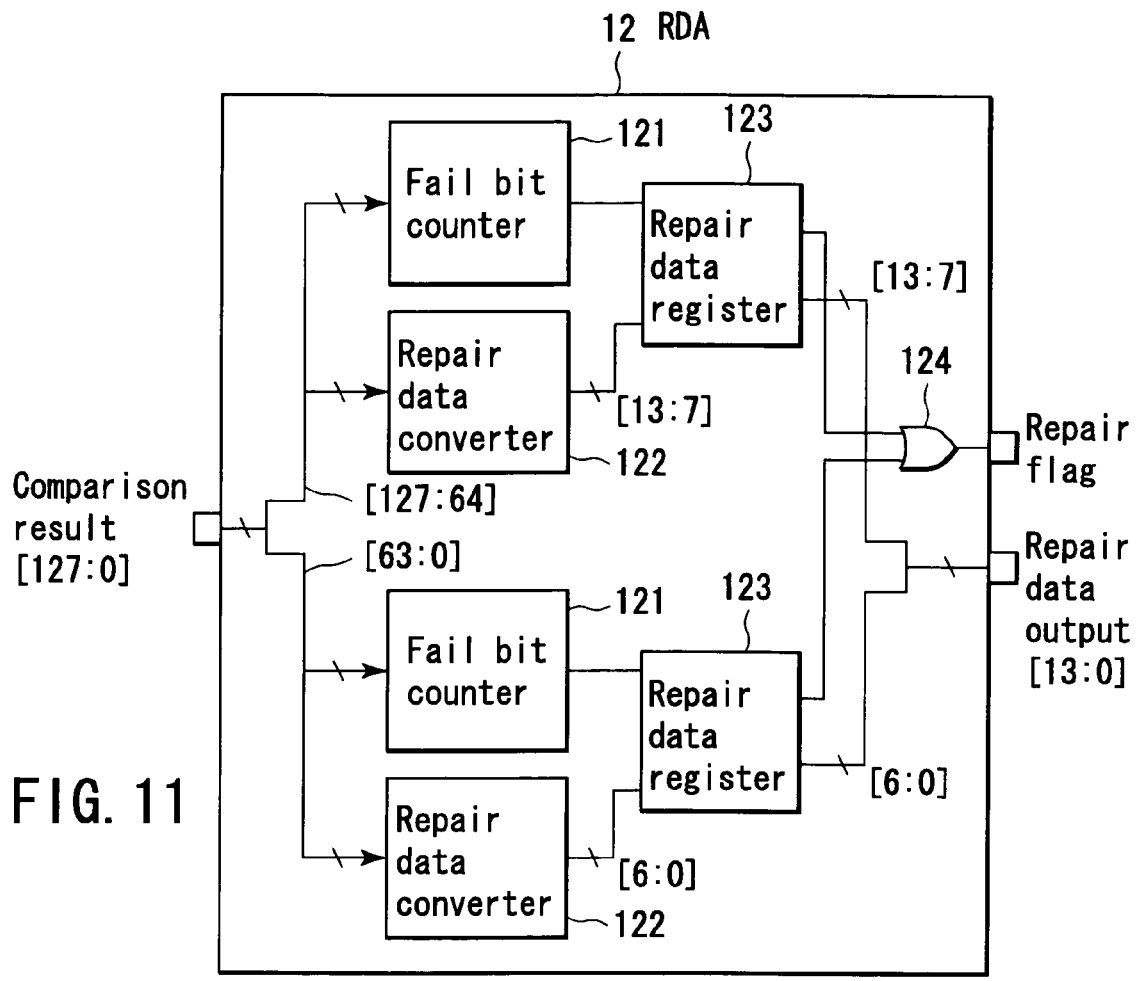
FIG. 11 is a block diagram showing the detailed configuration of a repair data analyzer shown in FIG. 4.

FIG. 11 shows the configuration of the repair data analyzer (RDA) 12. The repair data analyzer 12 is supplied with the 128-bit comparison result (Comparison Result [127:0]) outputted from the exclusive OR gate circuits 115 shown in FIG. 6. The 128-bit comparison result (Comparison Result [127:0]) is classified into two groups corresponding to sections (Section 0–63, Section 64–127) of the memory cell array shown in FIG. 7. One group comprises 64 bits, that is, comparison result (Comparison Result [63:0]), and the other group comprises 64 bits, that is, comparison result (Comparison Result [127:64]). The comparison result (Comparison Result [63:0], [127:64]) is supplied to fail bit counters 121 and repair data converters 122.

The fail bit counter 121 counts the number of fail bits included in the comparison result comprising 64 bits. The repair data converter 122 specifies the section number having the fail bit (fail memory cell) based on the comparison result outputted from the exclusive OR gate circuits 115. The outputs of the fail bit counter 121 and the repair data converter 122 are supplied to a repair data register 123, and stored therein.

The count number of the fail bit stored in the repair data register 123 is outputted as a repair flag (Repair Flag) via an OR gate circuit 124. In addition, the section number having the fail bit is outputted as repair data (Repair Data Output).

Figure 1:
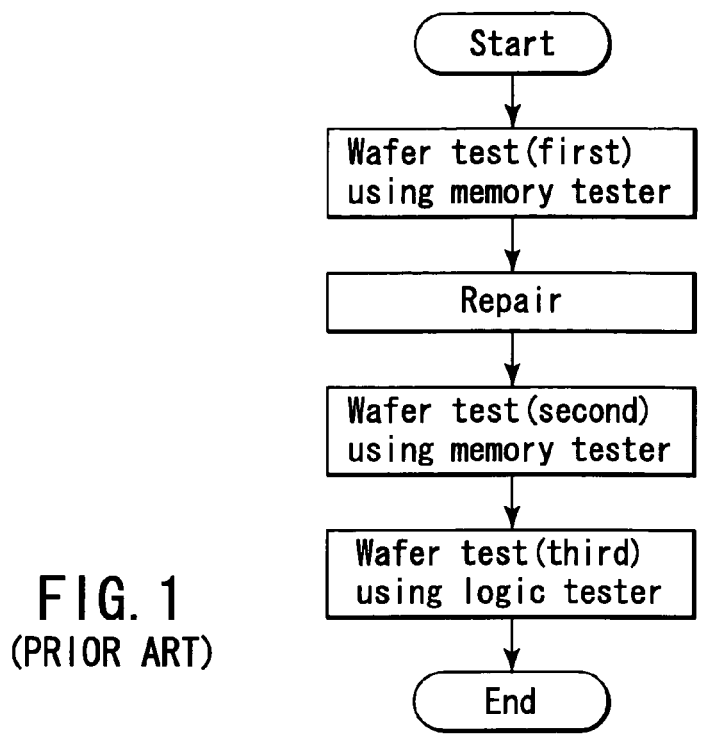
FIG. 1 is a flowchart to explain a general test process in a wafer state of a memory embedded logic LSI device having a redundancy function.
Figure 2:
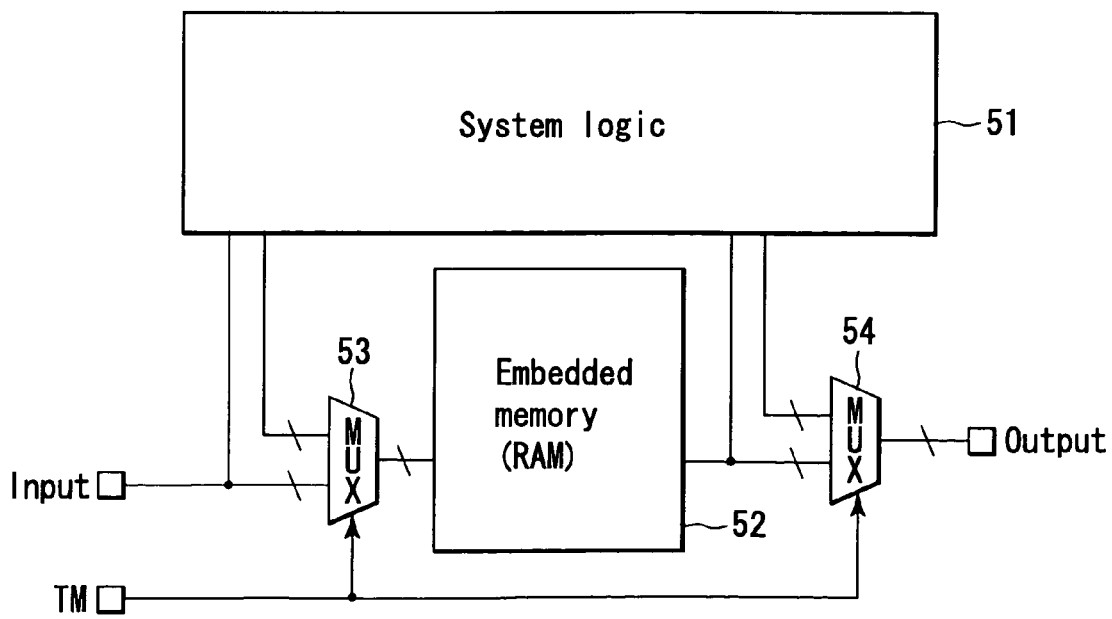
FIG. 2 is a block diagram schematically showing the configuration of a memory embedded logic LSI device employing a multiplexer separation method.
Figure 3:
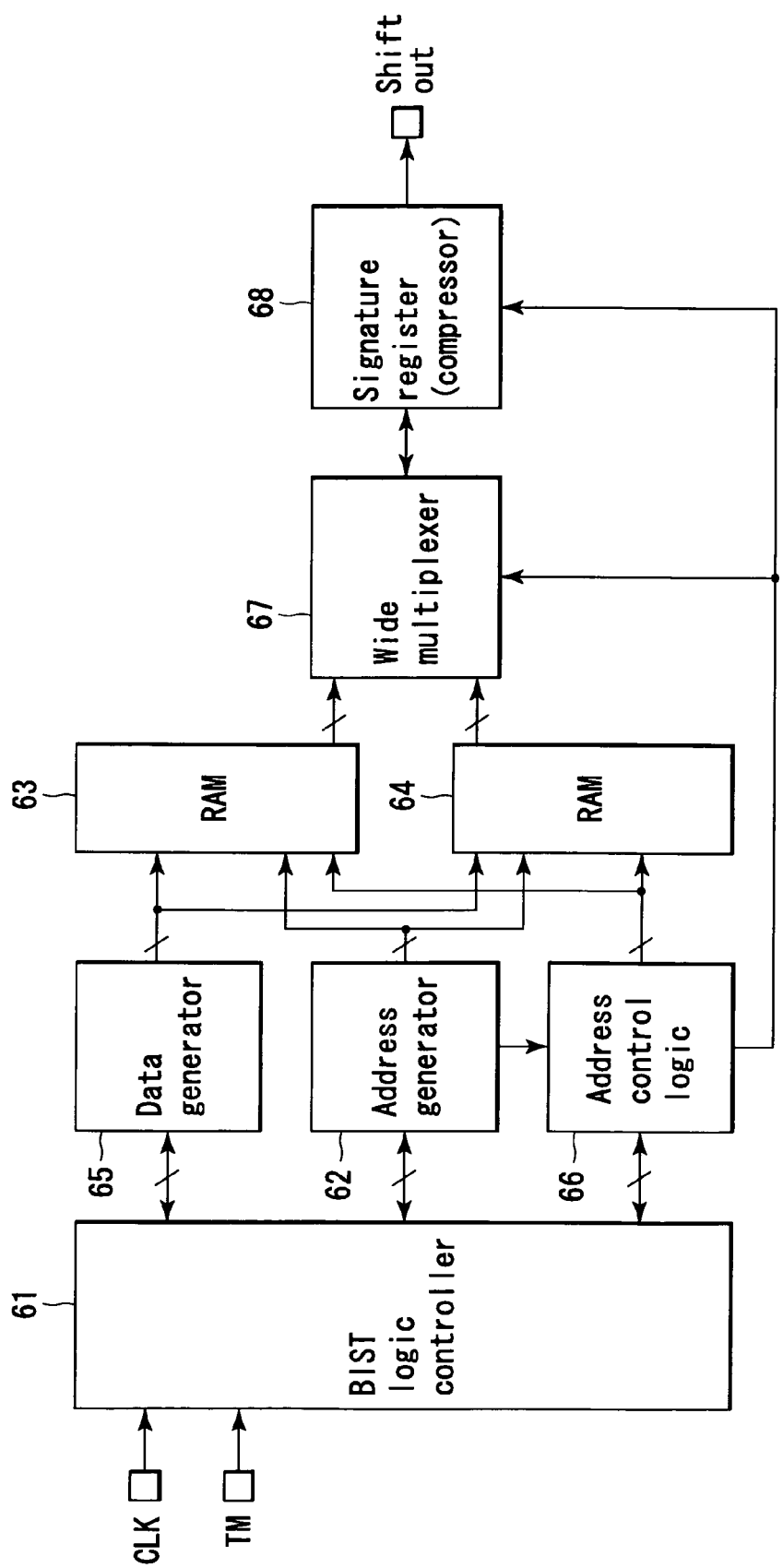
FIG. 3 is a block diagram showing the configuration of a conventional memory embedded logic LSI device having a BIST circuit.
Figure 12:
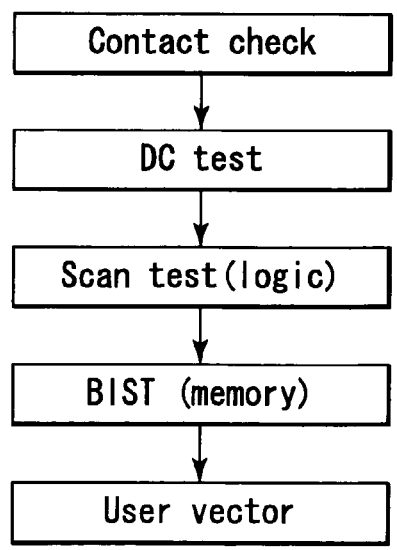
FIG. 12 is a flowchart to explain the test process carried out in the conventional memory LSI device having a BIST circuit.

The test operation in the conventional memory LSI device having the BIST circuit shown in FIG. 3 will be explained below with reference to the flowchart shown in FIG. 12.

First, a contact check is made. The contact check is a test for checking a conductive state. More specifically, a check is made whether LSI chip pins (signal terminal) and test jigs such as a test board and probe card electrode normally contact with each other.

A DC test is carried out. According to the DC test, direct voltage/current values of the signal outputted from each output pin are measured, and a test is carried out to check whether or not the direct voltage/current have a normal value.

A scan test for logic circuit is carried out. According to the scan test, the test of the logic circuit is carried out in the following manner. A predetermined input signal is supplied to operate the logic circuit, and thereafter, signals in nodes requiring a check are stored in an internal register. Thereafter, a clock signal is externally inputted as a synchronizing signal, and registers are connected in series to successively read data stored in each register.

A memory test using the BIST circuit is carried out. In the test operation mode, a clock signal is inputted as the synchronizing signal. Thereafter, user vector of user own is checked.

The frequency of the clock signal used for the scan test of the logic circuit is usually about 20 to 50 MHz. On the other hand, the frequency of the clock signal used for the memory test using the BIST circuit is usually about 100 MHz.

Conventionally, two clock signals having different frequencies are supplied using one clock pin. For this reason, the scan test of the logic circuit and the memory test using the BIST circuit must be carried out with a time lag. As a result, test time is considerably long as compared with that of the logic LSI device, and also, the test cost increases.

On the contrary, in the LSI device of the embodiment, the clock signal CLK1 supplied to the BIST block 15 in the memory test operation is independent of the clock signal CLK2 used for testing the system logic 19, as described in FIG. 4. By doing so, two clock signals CLK1 and CLK2 are simultaneously supplied to carry out the foregoing tests independently and concurrently. In this case, the frequency of the clock signal CLK1 used for the memory test operation is about 100 MHz. On the other hand, the frequency of the clock signal CLK2 used for testing the system logic 19 is about 20 to 50 MHz.

Figure 13:
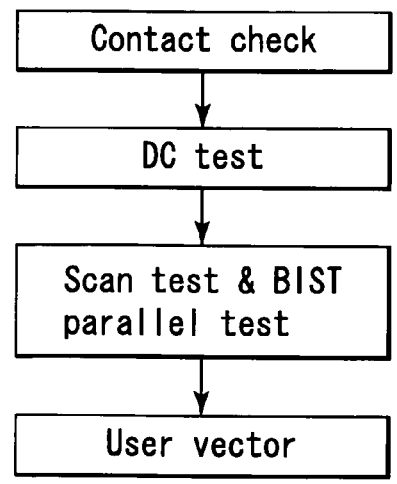
FIG. 13 is a flowchart to explain the test process carried out in the memory embedded logic LSI device shown in FIG. 4.

In the memory embedded logic LSI device of FIG. 4, the test is carried out according to the test operation flowchart shown in FIG. 13. More specifically, a contact check and DC tests are carried out, and thereafter, parallel tests of the scan test of the logic circuit and the memory test using the BIST circuit are carried out. As a result, it is possible to considerably reduce the time taken for the test.

In the memory test operation, the repair data analyzer (RDA) 12 generates the address of the column where a fail memory cell occurs. The address is outputted as repair data via the selector circuit 13. Thus, the repair data is used, and thereby, it is possible to readily replace the column having a fail memory cell with spare cell included in the spare column.

The present invention is not limited to the foregoing embodiment, naturally, various modifications are possible. For example, the repair data analyzer (RDA) 12 has the configuration shown in FIG. 11. In brief, any other configuration may be employed as long as repair data (fail address) and a repair flag are generated based on the comparison result between read data from the memory block and the expected data.

What is claimed is:

1. A semiconductor memory device comprising:
at least one memory block including a plurality of memory cells and a plurality of spare cells, and having a redundancy function of replacing a fail memory cell with the spare cell if the fail memory cell exists in the plurality of memory cells;
at least one determination/fail address generator circuit configured to connect to said at least one memory block, said at least one determination/fail address generator circuit being configured to determine whether or not a memory cell included in the at least one memory block is defective, said at least one determination/fail address generator circuit further being configured to generate a fail address corresponding to the memory cell determined as being defective;
a first control circuit configured to connect to said at least one memory block and said at least one determination/fail address generator circuit, the first control circuit being supplied with a first clock signal having a first frequency in a test operation mode, the first control circuit being operated in synchrony with the first clock signal to control each operation of said at least one memory block and said at least one determination/fail address generator circuit; and
a logic circuit configured to be supplied with a second clock signal having a second frequency in the test operation mode, the logic circuit being operated in synchrony with the second clock signal while performing data exchange with said at least one memory block in a normal operation mode.

2. The device according to claim 1, wherein said at least one memory block includes a plurality of memory blocks, and said at least one determination/fail address generator circuit includes a plurality of determination/fail address generator circuits arranged correspondingly to said plurality of memory blocks.

3. The device according to claim 2, wherein the first control circuit includes:
a data generator circuit configured to generate data, the data generator circuit being further configured to supply the generated data to said plurality of memory blocks;
an address generator circuit configured to generate an address, the address generation circuit being further configured to supply the generated address to said plurality of memory blocks;
a control signal generator circuit configured to generate various control signals used for controlling the operation of said plurality of memory blocks, the control signal generator circuit being configured to supply the various control signals to said plurality of memory blocks;
an analyzer configured to receive determination result from said plurality of determination/fail address generator circuits, the analyzer being further configured to determine whether or not said plurality of memory blocks are defective; and
a second control circuit configured to control each operation of the data generator circuit, the address generator circuit, the control signal generator circuit and the analyzer.

4. The device according to claim 2, wherein each of said plurality of determination/fail address generator circuits includes:
   a plurality of multiplexers configured to select a first data read from said plurality of memory blocks and an input second data;
   a plurality of first register circuits configured to store data selected by said plurality of multiplexers, said plurality of first register circuits being configured to supply the stored data to said plurality of multiplexers as the second data;
   a plurality of comparator circuits configured to compare data stored in said plurality of first registers with expected data;
   a repair data analyzer configured to receive comparison results from said plurality of comparator circuits, and based on these comparison results, the repair data analyzer being further configured to generate a first flag showing whether or not a redundancy function of said plurality of memory blocks should be used, and to generate an address on said plurality of memory blocks where a fail memory cell exists as repair data; and
   a flag output circuit configured to receive comparison results from said plurality of comparator circuits, and based on these comparison results, the flag output circuit being configured to output a second flag showing whether or not a fail memory cell exists in said plurality of memory blocks.

5. The device according to claim 4, wherein each of said plurality of comparator circuits is an exclusive OR gate circuit.

6. The device according to claim 4, wherein the flag output circuit includes:
   a first OR gate circuit configured to input a comparison result of plurality of plurality of comparator circuits;
   a second OR gate circuit configured to input a first signal outputted from the first OR gate circuit and a second signal externally supplied; and
   a second register circuit configured to store the output of the second OR gate circuit, the second register circuit being further configured to output the stored signal as the second flag while supplying the stored signal as the second signal to the second OR gate circuit.

7. The device according to claim 4, wherein the repair data analyzer includes:
   a counter configured to receive the comparison result of said plurality of comparator circuits, the counter being further configured to count the number of fail memory cells;
   a repair converter configured to receive the comparison result of said plurality of comparator circuits, the repair converter being further configured to specify an address on said plurality of memory blocks where a fail memory cell exists; and
   a third register circuit configured to store count contents of the counter and the address specified by the repair converter, the third register circuit being further configured to output the first flag in accordance with the count contents while outputting the stored address as the repair data.

8. The device according to claim 2, further comprising:
   a selector circuit configured to select and output the fail address outputted from said plurality of determination/fail address generator circuits.

9. The device according to claim 1, wherein said plurality of memory cells and plurality of spare cells are both dynamic memory cells.

10. The device according to claim 1, wherein said plurality of memory cells and plurality of spare cells are both static memory cells.

11. The device according to claim 1, wherein said plurality of memory cells and plurality of spare cells are both ferroelectric memory cells having a ferroelectric capacitor holding a ferroelectric film between a pair of electrodes.

12. The device according to claim 1, wherein the first frequency is higher than the second frequency.

13. A semiconductor memory device comprising:
   a first clock signal terminal supplied with a first clock signal in a test operation mode, the first clock signal has a first frequency;
   a second clock signal terminal supplied with a second clock signal in the test operation mode, the second clock signal has a second frequency lower than the first frequency;
   at least one memory block including a plurality of memory cells and a plurality of spare cells, and having a redundancy function of replacing a fail memory cell with the spare cell if the fail memory cell exists in said plurality of memory cells;
   at least one determination/fail address generator circuit configured to connect to said at least one memory block, said at least one determination/fail address generator circuit being further configured to determine whether or not a memory cell included in at least one memory block is defective, and said at least one determination/fail address generator circuit being further configured to generate a fail address corresponding to the memory cell determined as being defective;
   a first control circuit configured to connect to said at least one memory block and said at least one determination/fail address generator circuit, the first control circuit being operated in synchrony with the first clock signal to control each operation of said at least one memory block and said at least one determination/fail address generator circuit; and
   a logic circuit configured to operate in synchrony with the second clock signal in the test operation mode, the logic circuit being further configured perform a data exchange with said at least one memory block in a normal operation mode.

14. The device according to claim 13, wherein said at least one memory block includes a plurality of memory blocks, and said at least one determination/fail address generator circuit includes a plurality of determination/fail address generator circuits arranged correspondingly to said plurality of memory blocks.

15. The device according to claim 14, wherein the first control circuit includes:
   a data generator circuit configured to generate data, the data generator circuit being further configured to supply the generated data to said plurality of memory blocks;
   an address generator circuit configured to generate an address, the address generator circuit being further configured to supply the generated address to said plurality of memory blocks;
   a control signal generator circuit configured to generate various control signals used for controlling the operation of said plurality of memory blocks, the control signal generator circuit being further configured to supply the various control signals to said plurality of memory blocks;
   an analyzer configured to receive determination result from said plurality of determination/fail address generator circuits, the analyzer being further configured to determine whether or not said plurality of memory blocks are defective; and a second control circuit configured to control each operation of the data generator circuit, the address generator circuit, the control signal generator circuit and the analyzer.

16. The device according to claim 14, further comprising:

a selector circuit configured to select and output the fail address outputted from said plurality of determination/fail address generator circuits.

17. The device according to claim 13, wherein each of said plurality of determination/fail address generator circuits includes:

a plurality of multiplexers configured to select a first data read from said plurality of memory blocks and an input second data;

a plurality of first register circuits configured to store data selected by said plurality of multiplexers, said plurality of first register circuits being further configured to supply the stored data to said plurality of multiplexers as the second data;

a plurality of comparator circuits configured to compare data stored in said plurality of first registers with expected data;

a repair data analyzer configured to receive comparison results from said plurality of comparator circuits, and based on these comparison results, the repair data analyzer being further configured to generate a first flag showing whether or not a redundancy function of said plurality of memory blocks should be used, and to generate an address on said plurality of memory cell blocks where a fail memory cell exists as repair data; and a flag output circuit configured to receive comparison results from said plurality of comparator circuits, and based on these comparison results, the flag output circuit being further configured to output a second flag showing whether or not a fail memory cell exists in said plurality of memory cell blocks.

18. The device according to claim 17, wherein each of said plurality of comparator circuits is an exclusive OR gate circuit.

19. The device according to claim 17, wherein the flag output circuit includes:

a first OR gate circuit configured to input a comparison result of said plurality of comparator circuits;

a second OR gate circuit configured to input a first signal outputted from the first OR gate circuit and a second signal externally supplied; and a second register circuit configured to store the output of the second OR gate circuit, the second register circuit being further configured to output the stored signal as the second flag while supplying the stored signal as the second signal to the second OR gate circuit.

20. The device according to claim 17, wherein the repair data analyzer includes:

a counter configured to receive the comparison result of said plurality of comparator circuits, the counter being further configured to count the number of fail memory cells;

a repair converter configured to receive the comparison result of said plurality of comparator circuits, the repair converter being further configured to specify an address on said plurality of memory blocks where a fail memory cell exists; and a third register circuit configured to store count contents of the counter and the address specified by the repair converter, the third register circuit being further configured to output the first flag in accordance with the count contents while outputting the stored address as the repair data.

21. The device according to claim 13, wherein said plurality of memory cells and said plurality of spare cells are both dynamic memory cells.

22. The device according to claim 13, wherein said plurality of memory cells and said plurality of spare cells are both static memory cells.

23. The device according to claim 13, wherein said plurality of memory cells and said plurality of spare cells are both ferroelectric memory cells having a ferroelectric capacitor holding a ferroelectric film between a pair of electrodes.

* * * * *